United States Patent
Yamana

(10) Patent No.: US 6,228,558 B1
(45) Date of Patent: May 8, 2001

(54) CHEMICALLY AMPLIFIED RESIST

(75) Inventor: Mitsuharu Yamana, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/536,700

(22) Filed: Mar. 28, 2000

(30) Foreign Application Priority Data

Mar. 29, 1999  (JP) .................................................. 11-085664

(51) Int. Cl.$^7$ ..................................................... G03F 7/004
(52) U.S. Cl. .................. 430/270.1; 430/311; 430/286.1; 430/281.1
(58) Field of Search ................................ 430/270.1, 311, 430/286.1, 281.1

(56) References Cited

U.S. PATENT DOCUMENTS

| | | | |
|---|---|---|---|
| 5,759,739 | * 6/1998 | Takemura et al. | 430/270.1 |
| 5,942,367 | * 8/1999 | Watanabe et al. | 430/170 |
| 6,106,993 | * 8/2000 | Watanabe et al. | 430/270.1 |
| 6,106,995 | * 8/2000 | Dixit et al. | 430/270.1 |
| 6,143,466 | * 11/2000 | Choi | 430/270.1 |

FOREIGN PATENT DOCUMENTS

| | | |
|---|---|---|
| 9-73173 | 3/1997 | (JP) . |
| 10-10738 | 1/1998 | (JP) . |
| 10-204125 | 8/1998 | (JP) . |
| 10-306120 | 11/1998 | (JP) . |

* cited by examiner

*Primary Examiner*—Hoa Van Le
*Assistant Examiner*—Amanda C. Walke
(74) *Attorney, Agent, or Firm*—Young & Thompson

(57) ABSTRACT

A far-ultraviolet resist is a chemically amplified resist comprising a base resin and a photoacid generator. As the base resin, used are resins having a cyclic carbonate bonded by an amid bond, which is highly transparent to the far-ultraviolet radiation and is excellent in resistance to etching. These resins include t-butyl protective poly(2,5-carboxy norbornane amide), t-butyl protective poly(p-carboxy amino-cyclohexane amide), and t-butyl protective poly(2,5-carboxy amino-adamantane amide). These resins provide excellent adhesion to Si substrates, improved resistance to dragging and placement after exposure, and improved pattern shapes.

4 Claims, No Drawings

CHEMICALLY AMPLIFIED RESIST

BACKGROUND OF THE INVENTION

1. Technical Field of the Invention

The present invention relates to a chemically amplified resist comprising a base resin and a photoacid generator and, more particularly, to a far-ultraviolet resist which provides excellent adhesion to Si substrates, improved resistance to dragging and placement after exposure, and improved pattern shapes.

2. Description of the Related Art

Conventional far-ultraviolet resists comprising a base resin and a photoacid generator include, as said base resin, a resin (t-butyl protective poly-carboxyl nor-bornane) with a cyclic carbonate employed, high in transparency to the far ultraviolet radiation, excellent in resistance to etching, and captured in the principal chain to allow a carbon atom—carbon atom bond as shown by formula (1) below.

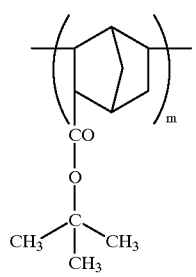

(1)

In addition, conventional far-ultraviolet resists comprising a base resin and a photoacid generator also include a resin (tetra-hydroxyl protective carboxy tetra-cyclo dodecyl-methacrylate) which is branched from the principal chain as shown by formula (2) below.

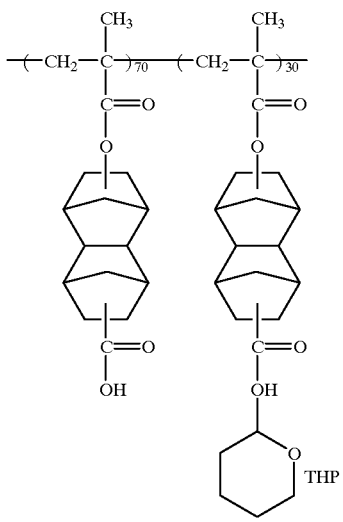

(2)

Conventional far-ultraviolet resists have mainly employed these resins.

However, the aforementioned conventional far-ultraviolet resists provide inferior adhesion to Si substrates and provide deformed patterns when employed in fine patterns or defocused. Moreover, some of these conventional far-ultraviolet resists cannot be developed with a 2.38% TMAH standard developer, presenting a problem in that the resists are used with difficulty in practice.

Furthermore, a conventional KrF ($\lambda$=248 nm) resist that employs hydroxystyrene as the base resin and is comparatively good in resistance to etching cannot be used for lithography in which ArF ($\lambda$=193 nm) or a far-ultraviolet radiation shorter in wavelength than that which is used, because of significant absorption thereof. Accordingly, a resist with an alicyclic group is now used, however, this resist provides significant hydrophobicity, thus leading to a drawback of inferior adhesion between the resist and the substrate. Moreover, introduction of a unit for improving the adhesion would cause the ratio of the alicyclic group to decrease and thus the resistance to etching to deteriorate, so that both adhesion and resistance to etching have conventionally been satisfied with difficulty at the same time.

SUMMARY OF THE INVENTION

The object of the present invention is to provide a chemically amplified resist that provides excellent adhesion to Si substrates, improved resistance to dragging and placement after exposure, improved pattern shapes, and can be preferably employed as a far-ultraviolet resist.

The chemically amplified resist relating to the present invention, which comprises a base resin and photoacid generator, is characterized in that said base resin has transparency to far-ultraviolet radiation and comprises a resin having a cyclic carbonate with resistance to etching bonded thereto by an amid bond.

The chemically amplified resist of the present invention includes polar groups of a carbonyl group and an amino group, and thus provides excellent adhesion to Si substrates having a high-polarity silanol group on the surface thereof. In addition, the amino group in the resin structure captures acids generated by exposure to prohibit the diffusion of the acids, thereby also improving resistance to dragging and placement after exposure and improving pattern shapes.

The resins used as a base resin in the present invention have a cyclic carbonate bonded by an amid bond, which is highly transparent to the far-ultraviolet radiation and excellent in resistance to etching. These resins are preferably, for example, t-butyl protective poly(2,5-p-carboxy nor-bornane amide) shown by formula (3) below, t-butyl protective poly(p-carboxy amino-cyclohexane amide) shown by formula (4) below, and t-butyl protective poly(2,5-carboxy amino-adamantane amide) shown by formula (5) below.

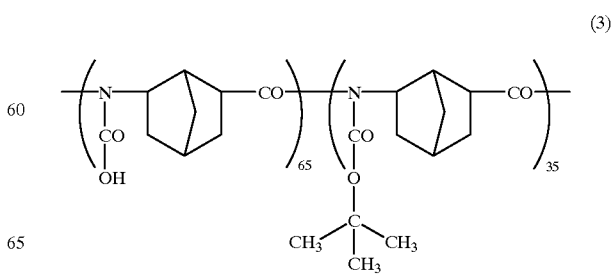

(3)

(4)

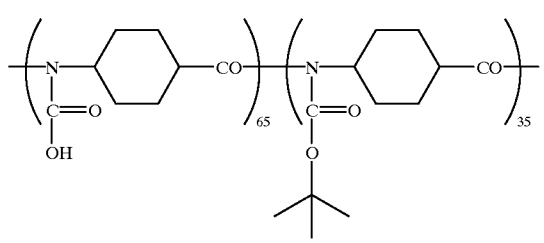

(8)

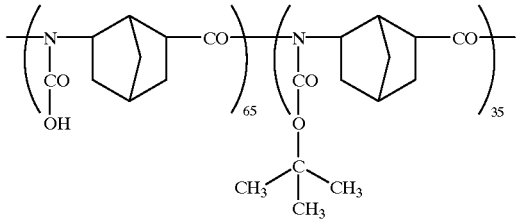

(5)

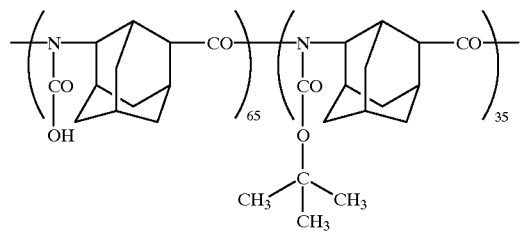

A resin comprising said t-butyl protective poly(2,5-carboxy nor-bornane amide) with a protection ratio of 35% with a t-butyl group and the tri-phenyl sulfonium tri-fluoro methane sulfonic acid (at a ratio of 8 wt % with respect to resin) shown by following formula (9) was prepared and then exposed to ArF laser light, so that a line-and-space (hereinafter referred to as L&S pattern) of 0.17 μm in width (hereinafter referred to as L&S pattern) was resolved.

(9)

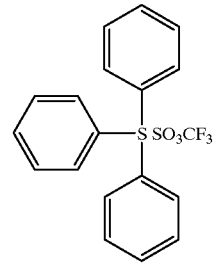

The chemically amplified resist of the present invention includes polar groups of a carbonyl group and an amino group, and thus provides excellent adhesion to Si substrates having a high-polarity silanol group on the surface thereof. In addition, the amino group in the resin structure captures acids generated by exposure to prohibit the diffusion of the acids, thereby also improving resistance to dragging and placement after exposure and improving pattern shapes.

The focal depth of a L&S pattern of 0.18 μm in width was 0.5 μm. No pattern deformation was found in the L&S pattern of 0.18 μm in width even when defocused by ±0.20 μm. Moreover, the rate of etching with $Cl_2$ resulted in a preferable ratio of 1.30 with respect to a novolak resist.

THE PREFERRED EMBODIMENTS OF THE INVENTION

The embodiments of the present invention are explained in detail below.

The 2,5-carboxy amino nor-bornane shown by formula (6) below was employed as a monomer and was polymerized by heat treatment or by using a catalyst. Then, the amine portion of the resultant polymer was added with the t-butyl carboxy chloride shown by formula (7) below. Further, de-protection reaction was allowed to proceed with an acid catalyst until the predetermined protection ratio (35%) was reached in order to be refined into the resin, t-butyl protective poly (2,5-carboxy nor-bornane amide), with a molecular weight of 15,000, shown by formula (8) below.

Now, a second embodiment of the present invention is explained.

The p-carboxy amino cyclohexane shown by formula (10) below was employed as a monomer and was polymerized by heat treatment or by using a catalyst.

(10)

Then, the amine portion of the resultant polymer was added with the t-butyl carboxy chloride. Further, a de-protection reaction was allowed to proceed with an acid catalyst until the predetermined protection ratio (35%) was reached in order to be refined into the resin, p-carboxy amino cyclohexane amide, with a molecular weight of 12,000, shown by formula (11) below.

(6)

(7)

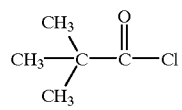

(11)

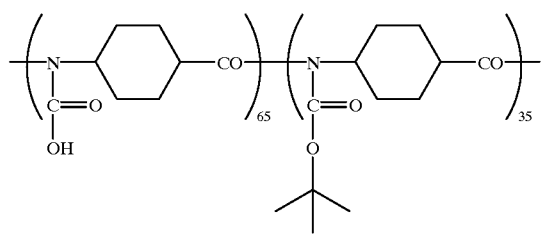

A resist comprising said t-butyl protective poly(p-carboxy amino cyclohexane amide) with the protection ratio of 35% with a t-butyl group and the tri-phenyl sulfonium tri-flate (at a ratio of 8 wt % with respect to resin) was prepared and then exposed to ArF laser light, so that a L&S pattern of 0.17 μm in width was resolved. The focal depth of a L&S pattern of 0.18 μm in width was 0.4 μm. No pattern deformation was found in the L&S pattern of 0.18 μm in width even when defocused by ±0.20 μm. The rate of etching with $Cl_2$ resulted in a preferable ratio of 1.50 with respect to a novolak resist.

Now, a third embodiment of the present invention is explained.

The 2,5-carboxy adamantane shown by formula (12) below was employed as a monomer and was polymerized by heat treatment or by using a catalyst. Then, the amine portion of the resultant polymer was added with the t-butyl carboxy chloride.

(12)

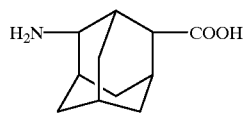

Further, a de-protection reaction was allowed to proceed with an acid catalyst until the predetermined protection ratio (35%) was reached in order to be refined into the resin, t-butyl protective poly(2,5-carboxy amino-adamantane amide), with a molecular weight of 8,000, shown by formula (13) below.

(13)

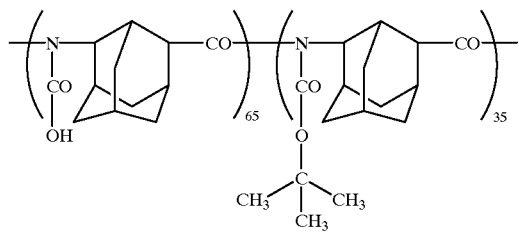

A resist comprising said t-butyl protective poly(2,5-carboxy amino-adamantane amide) with a protection ratio of 35% with a t-butyl group and a photoacid generator of the tri-phenyl sulfonium tri-flate (at a ratio of 7 wt % with respect to resin) was prepared and then exposed to ArF laser light, so that a L&S pattern of 0.17 μm in width was resolved. The focal depth of the L&S pattern of 0.18 μm in width was 0.50 μm. No pattern deformation was found in the L&S pattern of 0.18 μm in width even when defocused by ±0.20 μm. The rate of etching with $Cl_2$ resulted in a preferable ratio of 1.55 with respect to a novolak resist.

What is claimed is:

1. A chemically amplified resist comprising a base resin and photoacid generator, wherein said base resin has transparency to far-ultraviolet radiation and comprises a resin having a cyclic carbonate with resistance to etching bonded thereto by an amid bond.

2. The chemically amplified resist according to claim 1, wherein said base resin is t-butyl protective poly(2,5-carboxy nor-bornane amide) shown in the formula below

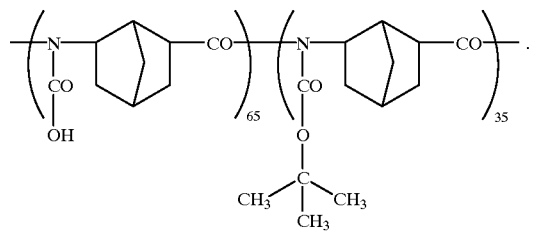

3. The chemically amplified resist according to claim 1, wherein said base resin is t-butyl protective poly(p-carboxy amino-cyclohexane amide) shown in the formula below

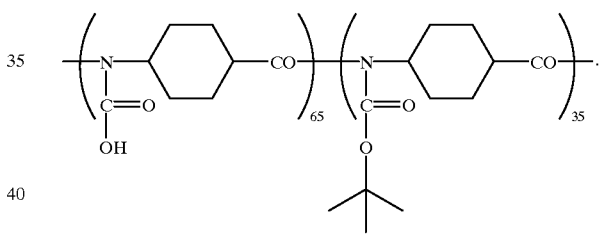

4. The chemically amplified resist according to claim 1, wherein said base resin is t-butyl protective poly(2,5-carboxy amino-adamantane amide) shown in the formula below

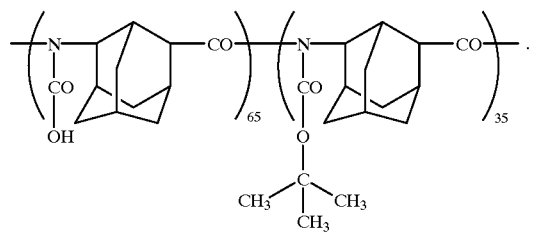

* * * * *

UNITED STATES PATENT AND TRADEMARK OFFICE
CERTIFICATE OF CORRECTION

PATENT NO.    : 6,228,558 B1
DATED         : May 8, 2001
INVENTOR(S)   : Mitsuharu Yamana It is certified that error appears in the above-identified patent and that said Letters Patent is hereby corrected as shown below:

Title page,
ABSTRACT, line 4, the first word "amid" should read -- amide --.

Column 2,
Line 35, the word "amid" should read -- amide --.

Column 4,
Line 14, the word "resin" should read -- resist --.

Column 6,
Line 14, the word "amid" should read -- amide --.

Signed and Sealed this

Twenty-third Day of April, 2002

Attest:

*Attesting Officer*

JAMES E. ROGAN
*Director of the United States Patent and Trademark Office*